United States Patent [19]

Jimenez

[11] Patent Number: 5,801,078
[45] Date of Patent: Sep. 1, 1998

[54] METHOD FOR MANUFACTURING DIFFUSED CHANNEL INSULATED GATE EFFECT TRANSISTOR

[75] Inventor: Jean Jimenez, Voiron, France

[73] Assignee: SGS-Thomson Microelectronics S.A., Saint Genis, France

[21] Appl. No.: 764,356

[22] Filed: Dec. 12, 1996

[30] Foreign Application Priority Data

Dec. 18, 1995 [FR] France ..................... 9515446

[51] Int. Cl.⁶ .................................... H01L 21/336
[52] U.S. Cl. .................. 438/306; 438/273; 438/527; 438/530; 438/307
[58] Field of Search .................... 438/306, 268, 438/273, 527, 305, 307, 530; 148/DIG. 126

[56] References Cited

U.S. PATENT DOCUMENTS

| | | | |
|---|---|---|---|
| 4,502,069 | 2/1985 | Schuh | 357/23.4 |
| 5,057,884 | 10/1991 | Suzuki et al. | 357/23.4 |
| 5,178,370 | 1/1993 | Clark et al. | 438/138 |
| 5,182,222 | 1/1993 | Malhi et al. | 438/273 |
| 5,187,117 | 2/1993 | Zommer | 438/273 |
| 5,510,281 | 4/1996 | Ghezzo et al. | 438/268 |

FOREIGN PATENT DOCUMENTS

| | | | |
|---|---|---|---|
| A-0 658 940 | 6/1995 | European Pat. Off. . | |
| 62-150770 | 7/1987 | Japan | 148/DIG. 126 |
| 63-84164 | 4/1988 | Japan . | |
| A-2 150 348 | 6/1985 | United Kingdom . | |

OTHER PUBLICATIONS

French Search Report from French Patent Application 95 15446, filed Dec. 18, 1995.

IBM Technical Disclosure Bulletin, vol. 26, No. 6, Nov. 1983, New York, US, pp. 3025–3026, Anonymous: "Simple Realization of an Edge–Doped FET".

Codella C. F., et al. "Halo Doping Effects in Submicron DI-LDD Device Design", International Electron Devices Meeting, Technical Digest, Washington, D.C., USA, 104 Dec. 1985, 1985 New York, NY, USA IEEE, USA, pp. 230–233.

*Primary Examiner*—Michael Trinh
*Attorney, Agent, or Firm*—Wolf, Greenfield & Sacks, P.C.

[57] ABSTRACT

A diffused channel insulated gate field effect transistor comprised of a gate isolation layer and a gate electrode positioned on an upper surface of a semiconductor substrate of a first conductivity type; a body region of a second conductivity type present in the semiconductor substrate lying below a part of the gate electrode, on at least one side thereof, and extending downwards to a first depth; a source region of said first conductivity type present in the body region, spaced away from the first end of the gate electrode, at the upper surface and extending downwards therefrom to a second depth, shallower than the first depth; and a lightly doped region of the first conductivity type present in the body region, at least partly between the source region and the gate electrode, extending downwards to a substantially shallower depth than the second depth.

22 Claims, 2 Drawing Sheets

PRIOR ART  Figure 1A
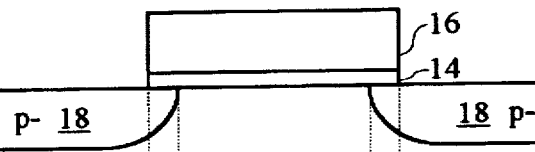
PRIOR ART  Figure 1B
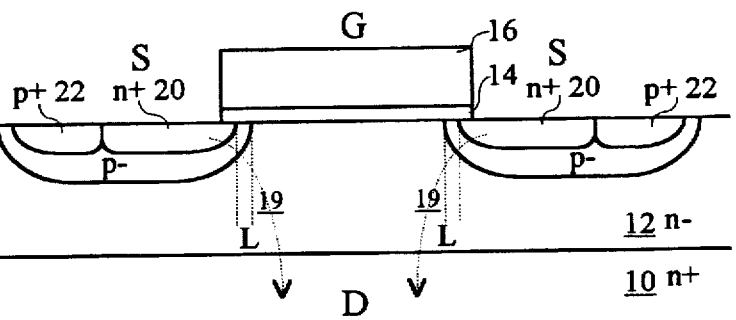
PRIOR ART  Figure 1C
PRIOR ART  Figure 1D

METHOD FOR MANUFACTURING DIFFUSED CHANNEL INSULATED GATE EFFECT TRANSISTOR

BACKGROUND OF THE INVENTION

1. Field of the Invention

The present invention relates to the manufacture of semiconductor integrated circuits, in particular to the manufacture of integrated circuits including diffused channel insulated gate field effect (DMOS) transistors.

2. Discussion of the Related Art

FIGS. 1A to 1D show the steps performed in the manufacture of a vertical DMOS transistor according to conventional techniques. As is well known in the art, the terms DMOS and CMOS are used to refer to any type of planar insulated gate field effect transistor, not necessarily constructed with a metal-oxide-semiconductor structure.

As shown in FIG. 1A, a first step begins with a highly n doped semiconductor layer 10 covered with a lightly doped n type layer 12 on its upper surface. Layer 12 is generally an epitaxied layer. The highly n doped region 10 may be a substrate or a layer buried within a p type substrate.

As shown in FIG. 1B, a gate insulator region 14 and a gate electrode 16 are formed on the upper surface of the epitaxied layer 12.

As shown in FIG. 1C, a p type body region 18 is introduced on both sides of the gate electrode 16. Typically, this region is formed by photolithographic masking followed by a p type implantation and a first thermal anneal step. This anneal step is performed at a very high temperature and over a long period of time. Subsequent to the thermal anneal step, each body region 18 extends under the gate electrode by a distance d.

As shown in FIG. 1D, highly n doped source regions 20 and highly p doped body contact regions 22 are introduced into the body regions 18, adjacent to each end of the gate electrode 16. Typically, these regions 20, 22 are introduced by photolithographic masking followed by ion implantation and a second thermal anneal step. This thermal anneal step is performed for a shorter time and at a lower temperature than the first anneal step. The length L of the body region remaining at the upper surface of the epitaxied layer 12 is the channel length of the DMOS transistor. The highly doped layer 10 corresponds to the drain region of the DMOS transistor. The conventional manufacturing process continues in a known manner, with the formation of interconnect layers, and contacts to gate, source, body and drain. Electrical contact to the drain region 10 is made either by a metallization of the lower surface of drain region 10 when the drain region is a substrate, or at the upper surface of an n type well contacting the drain region 10, when layer 10 is a buried layer on a p type substrate.

The formation of the p body region is typically done by implanting boron ions at an energy of 25 to 35 keV and an intensity of $\times 10^{13}$ to $4\times 10^{13}$ atoms.cm$^{-2}$. A severe thermal anneal step is then required to achieve a sufficient distance d of diffusion of this p body implant under the gate electrode. For example, for boron in silicon, which has a high diffusion coefficient, such a thermal anneal step may typically involve heating the circuit to 1160° C. for a period of 1 to 2 hours. Use of a dopant with a lower diffusion coefficient would require even more severe diffusion conditions, or may not even be possible.

Although shown as a vertical DMOS structure, a horizontal DMOS structure may be formed where the p body dopant is introduced on only one side of the gate electrode 16. A highly n doped drain contact region is then introduced on the other side of the gate electrode.

It is often required to integrate DMOS, CMOS and bipolar transistors in a single integrated circuit. This occurs in "BCD" (Bipolar—CMOS—DMOS) processes, which currently have CMOS and DMOS transistors with gate electrodes over 2 μm long. In this way, single integrated circuits may be used to control inductive devices, such as electric motors, or where high voltage holding capabilities are required. A typical application would be a computer disc controller, where bipolar circuitry is required for treating analog signals, CMOS transistors for control logic circuitry, and DMOS transistors for a high power interface to control the disc drive motors.

However, conventional techniques for producing DMOS transistors are incompatible with known processes for producing CMOS integrated circuits having transistor gate lengths of approximately 1.5 μm or less. In such integrated circuits, a threshold adjust region must be included under the gates of CMOS transistors to achieve a desired threshold voltage. Subjecting such a transistor to a severe anneal step as described above would suppress the threshold adjust region by diffusion effects, and the threshold voltages would no longer be controllable.

Furthermore, the severe first thermal anneal step described above would weaken the gate insulator layer, and reduce its breakdown voltage to an unacceptable level.

The severe thermal anneal step cannot simply be eliminated, as the high doping density of the source region 20 compared to the p body region 18, would preclude the choice of a pair of dopants allowing an optimized channel region to be formed.

SUMMARY OF THE INVENTION

An object of the present invention is to provide a method of fabricating DMOS transistors which are suitable for inclusion in manufacturing processes for CMOS integrated circuits with a transistor gate length of 1.5 μm and less.

A second object of the present invention is to provide such a process which does not require a high temperature, long duration anneal step.

A third object of the present invention is to provide such a method which introduces as few new steps as possible into the manufacturing process for CMOS integrated circuits.

Accordingly, the invention provides a diffused channel insulated gate field effect transistor, comprising a gate isolation layer and a gate electrode positioned on an upper surface of a semiconductor substrate of a first conductivity type; a body region of a second conductivity type present in the semiconductor substrate partially lying below a first end of the gate electrode, and extending downwards to a first depth; a spacer adjacent to the first end of the gate electrode, having a thickness approximately equal to the combined thicknesses of the gate electrode and the gate isolation layer and having a width; a source region of the first conductivity type present in the body region, spaced away from a first end of the gate electrode by a distance approximately equal to the width of the spacer, present at the upper surface and extending downwards therefrom to a second depth, shallower than the first depth; and a lightly doped region of the first conductivity type present in the body region, extending beneath the spacer from the source region to a location beneath the first end of the gate electrode, the lightly doped region extending downwards to a substantially shallower depth than the second depth.

According to an embodiment of the invention, a second body region is present in the semiconductor substrate, partially below a second end of the gate electrode, and extending downwards to a first depth; and a second lightly doped region of the first conductivity type is substantially placed below a second spacer adjacent to the second end of the gate electrode.

The invention also provides a method of manufacture of a diffused channel insulated gate field effect transistor, comprising the steps of: providing a semiconductor substrate of a first conductivity type, having an upper surface; defining a gate isolation layer and a gate electrode on the upper surface of the substrate; implanting a first dopant of a second conductivity type into the substrate adjacent to the gate electrode, and not following this implant with an anneal; implanting a second dopant of first conductivity type at a low density into the same region as the first dopant; forming spacers adjacent to ends of the gate electrode; implanting a third, source, dopant of first conductivity type at a high doping density; performing a thermal anneal, wherein the first dopant is chosen to diffuse more quickly than the second and third dopants, during the anneal step.

According to an embodiment of the invention, the thermal anneal step is performed at a temperature of less than 1000° C.

According to an embodiment of the invention the thermal anneal step is performed for a time of the order of 30 minutes.

According to an embodiment of the invention, the method of manufacture further comprises the step of implanting a fourth dopant of second conductivity type into regions where body contacts are to be formed, this implantation being performed such that, after anneal, the diffusion depth of this fourth dopant is less than the diffusion depth of the first dopant.

According to an embodiment of the method of the invention, the first dopant is boron, the second and third dopants are arsenic and the fourth dopant is boron, implanted in the form of boron fluoride.

BRIEF DESCRIPTION OF THE DRAWINGS

These and other objects, characteristics and advantages of the present invention will become apparent from the following description of certain particular embodiments of the present invention, given by way of non-limiting example, with reference to the accompanying drawings, wherein:

FIGS. 1A to 1D show cross sectional views of a DMOS transistor at various stages in a conventional manufacturing process according to the prior art.

As is customary in the domain of semiconductor devices, these figures are not drawn to scale. In particular, the vertical dimensions of certain features has been exaggerated for clarity.

DETAILED DESCRIPTION

FIGS. 2A to 2D illustrate a preferred process for the manufacture of DMOS transistors in integrated circuits containing both DMOS and CMOS transistors, according to the present invention. Features common with those shown in FIGS. 1A to 1D carry identical reference labels.

Figure 2A:
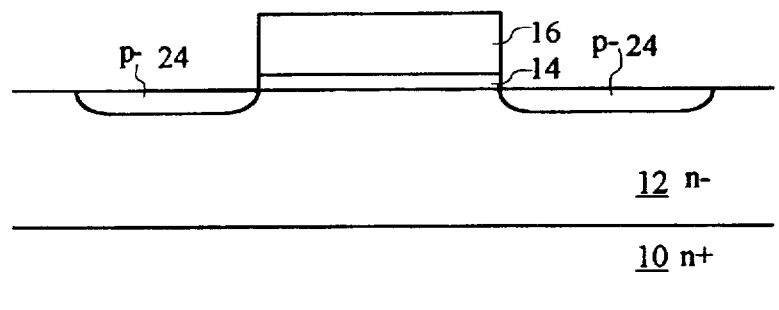
FIGS. 2A to 2D show cross sectional views of a DMOS transistor at various stages in a manufacturing process according to a preferred embodiment of the present invention.

In FIG. 2A, a highly n doped semiconductor layer 10 is provided with a lightly n doped epitaxial layer 12, a gate insulator layer 14 and gate electrode 16. Generally, the device shown in FIG. 2A is created through the performance of a number of manufacturing steps. In a first step, the semiconductor layer 10 is covered with the lightly doped n type layer 12 on its upper surface. Preferable, layer 12 is an epitaxied layer. In a subsequent series of steps, the gate insulator region 14 and gate electrode 16 are formed on the upper surface of layer 12. P type body implants 24 are then formed adjacent to both ends of the gate electrode 16. Significantly, no thermal anneal step is applied. Accordingly, the p type dopant does not diffuse into the semiconductor, neither vertically nor under the gate electrode 16.

Figure 2B:
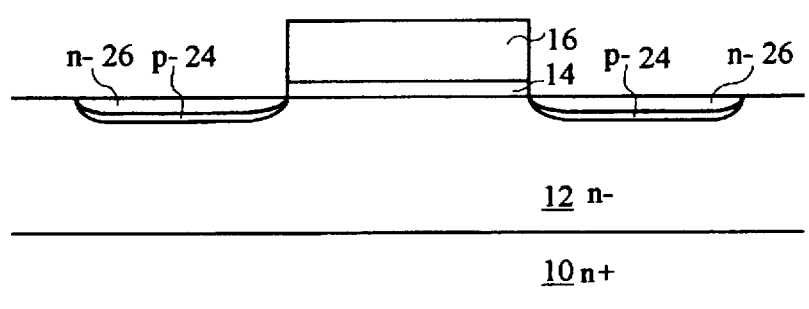
Figure 2C:
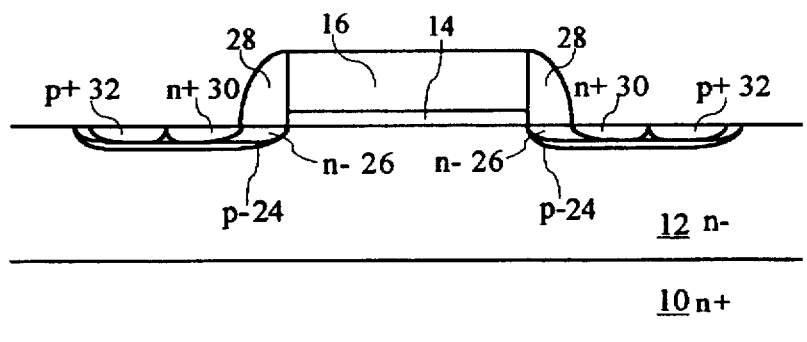

FIG. 2B shows the structure at a later step in the process of the present invention. A light n type implant 26 has been formed into the same regions as the p body implants 24. No anneal is performed at this stage, so this implant also does not diffuse into the semiconductor During the step illustrated in FIG. 2C, spacers 28 are produced adjacent to each end of the gate electrode 16. Spacers 28 may be, for example, spacers such as those currently used in the manufacturing of CMOS transistors.

In CMOS transistors, spacers such as spacers 28 allow the formation of lightly doped drain (LDD) regions between highly doped source and drain regions and the channel region. Without these LDD regions, the peak of the electric field would be at the edge of the drain region, just under the gate electrode. Such high electric fields could cause hot carrier injection into the gate insulation layer 14 and gate electrode 16. The LDD regions displace the point of maximum field strength to a location under the spacers 28, so that no damage to the gate insulation layer 14 can occur. Vertical DMOS transistors do not experience the problem of hot carrier injection. The presence of spacers does not appear to bring similar advantages to these structures. Accordingly, the step for forming spacers 28 may not be performed in conventional processes.

After formation of the spacers 28, the highly n doped source regions 30 are formed, along with highly p doped body contact regions 32.

Figure 2D:
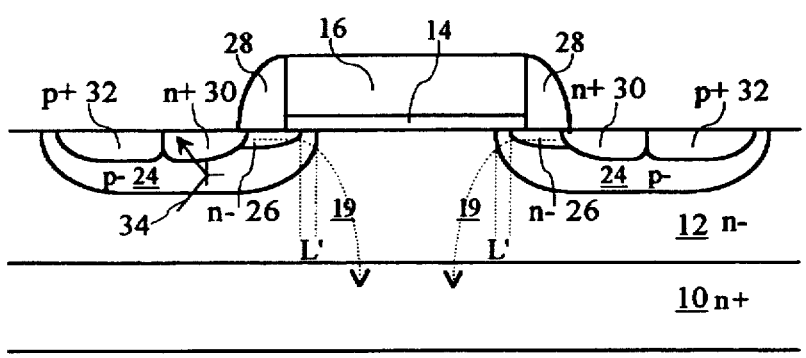

Only now, as represented in FIG. 2D, is a single thermal anneal step applied to the structure. It will be understood that, while the above described implantations are performed, so also are the implantations necessary for the formation of other components of the integrated circuit. In particular, CMOS and bipolar transistors may be formed. This anneal step must therefore be compatible with the other structures of the integrated circuit.

Referring to FIG. 2D, upon completion of this anneal step and according to the present invention, the DMOS channel region is formed Significantly, the DMOS channel region is not defined by the difference between a p type diffusion and a highly doped n type diffusion as in conventional devices. Instead, the DMOS channel region is defined by the difference between a p type diffusion 24 and an intermediately doped n diffusion 26. This arrangement makes possible the realization of the DMOS channel in a single thermal anneal step.

It will, however, be clear for one skilled in the art that the implementation of the invention requires a suitable choice of different dopants, their implantation conditions, and the conditions of the single thermal anneal. Therefore, a certain specific combination of steps performed in accordance with the present invention will be described in detail below.

EXAMPLE

The dopant which forms the p body region 24 is boron, implanted at an energy of 40 keV, at a dose of $4 \times 10^{13}$ atoms.cm$^{-2}$.

The dopant which forms the lightly doped n regions 26 is preferably arsenic implanted at an energy of 40 keV, at a dose of $3 \times 10^{13}$ atoms.cm$^{-2}$. This light n implant is preferably the same as that used to produce lightly doped drain (LDD) regions in n channel MOS transistors of the integrated circuit.

The dopant which forms the highly n doped source regions 30 is preferably arsenic, implanted at an energy of 40 keV, at a dose of $4 \times 10^{15}$ atoms.cm$^{-2}$. This n type implant is preferably the same as that used to produce drain and source regions in n channel MOS transistors of the integrated circuit.

The p body contact regions 32 are also doped with boron. However, to ensure that they have a depth after anneal step less than that of the p body 24, an implant species such as BF$_2$ is preferably used, which penetrates less deeply into the semiconductor than boron, and so produces a shallower region after anneal. This same dopant implant may be used to produce source and drain regions for p channel MOS transistors.

For the anneal step, the structure may be heated to 980° C. for 30 minutes, which corresponds to normal conditions for CMOS circuit manufacture. This allows the production of a 0.25 μm channel length, and the following diffusion profiles:

|  | Cs (atoms · cm$^{-3}$) | xj (μm) |
| --- | --- | --- |
| p body 24 | $2 \times 10^{18}$ | 0.5 |
| lightly doped n 26 | $4 \times 10^{18}$ | 0.15 |
| n source 30 | $3 \times 10^{20}$ | 0.25 |
| p body contact 32 | $1 \times 10^{20}$ | 0.5 | where Cs represents a surface concentration, and xj a corresponding junction depth of a particular region.

In an example of controlling a 12 V motor, the dimensions of the DMOS transistor should be fixed to withstand a voltage of 20 V, both to withstand voltage peaks caused by the inductance of the motor, and to allow for variation of the breakdown voltage with temperature. This may be achieved with the vertical DMOS structure of FIG. 2D, having a 2.5 μm long gate electrode 16, a 3 μm thick epitaxial layer 12, with a resistivity of 1 Ω.cm. Such a structure could have a breakdown voltage as high as 35 V. Lower resistivity and greater thickness of the epitaxial layer 12 would give a higher breakdown voltage.

Thus, a DMOS transistor is provided that may be incorporated into a standard CMOS logic or bipolar circuit manufacturing process, with only the addition of a single p body region implant.

Although described with reference to certain specific embodiments, numerous variations of the invention are possible, and will be apparent to those skilled in the art. For example, in addition to the vertical DMOS device produced according to the invention, with body and source regions on either side of the gate electrode, a horizontal DMOS structure could be produced as described with reference to the prior art.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A method for manufacturing a diffused channel insulated gate field effect transistor, comprising the steps of:
   providing a semiconductor substrate of a first conductivity type, said semiconductor substrate having an upper surface;
   forming a gate isolation layer and a gate electrode on said upper surface of said substrate;
   implanting a first dopant of a second conductivity type at a first doping density into a region of said substrate around said gate electrode;
   in the absence of thermal annealing said first dopant, implanting a second dopant of said first conductivity type at a second doping density that is less than said first doping density into said region comprising said first dopant;
   in the absence of thermal annealing said second dopant, forming spacers on said upper surface of said substrate adjacent to ends of said gate electrode to cover a portion of said region comprising said second dopant;
   implanting a third dopant of said first conductivity type at a third doping density that is greater than said first doping density into a portion of said region comprising said first dopant spaced away from said gate electrode by said spacers; and
   performing a thermal anneal, wherein said first dopant has a diffusion rate greater than said second and third dopants during said anneal step.

2. The method according to claim 1, wherein said thermal anneal step is performed at a temperature of less than 1000° C.

3. The method according to claim 2, wherein said thermal anneal step is performed for a time duration of approximately 30 minutes.

4. The method according to claim 1, further comprising the step of:
   prior to said annealing step, implanting a fourth dopant of said second conductivity type into regions where body contacts are to be formed, wherein said implantation is performed such that, after said annealing step, said fourth dopant achieves a diffusion depth that is less than a diffusion depth achieved by said first dopant.

5. The method according to claim 4, wherein said first dopant is comprised of boron.

6. The method according to claim 5, wherein said second dopant and said third dopant are each comprised of arsenic.

7. The method according to claim 6, wherein said fourth dopant is comprised of boron, implanted in the form of boron fluoride.

8. The method according to claim 1, wherein said step of implanting said second dopant is performed in the absence of thermal annealing causes said second dopant to not substantially diffuse vertically or horizontally into said first dopant and said semiconductor substrate.

9. The method according to claim 1, wherein said thermal anneal step is performed for a time duration of approximately 30 minutes.

10. The method according to claim 1, further comprising the step of:
    prior to said annealing step, implanting a fourth dopant of said second conductivity type into regions where body contacts are to be formed, wherein said implantation is performed such that, after said annealing step, said fourth dopant achieves a diffusion depth that is less than a diffusion depth achieved by said first dopant.

11. The method according to claim 1, wherein said fourth dopant is comprised of boron, implanted in the form of boron fluoride.

12. The method according to claim 1, wherein said first dopant is comprised of boron.

13. The method according to claim 1, wherein said second dopant and said third dopant are each comprised of arsenic.

14. A method for manufacturing a diffused channel insulated gate field effect transistor, comprising the steps of:

providing a semiconductor substrate of a first conductivity type, said semiconductor substrate having an upper surface;

forming a gate isolation layer and a gate electrode on said upper surface of said substrate;

implanting a first dopant of a second conductivity type at a first doping density into a region of said substrate adjacent to said gate electrode such that said first dopant does not substantially diffuse vertically or horizontally into said semiconductor;

implanting a second dopant of said first conductivity type at a second doping density that is less than said first doping density into said region comprising said first dopant such that said second dopant does not substantially diffuse vertically or horizontally into said semiconductor;

implanting a third dopant of said first conductivity type at a third doping density that is greater than said first doping density into said region comprising said first dopant, adjacent to a side of said second dopant opposite said gate electrode; and performing a thermal anneal, wherein said first dopant has a diffusion rate greater than a diffusion rate of said second and third dopants during said anneal step.

15. The method according to claim 14, further comprising the step of:

forming, prior to said third dopant implanting step, spacers on said upper surface of said substrate adjacent to ends of said gate electrode to cover a portion of said region comprising said first dopant.

16. The method according to claim 14, further comprising the step of:

prior to said annealing step, implanting a fourth dopant of said second conductivity type into regions where body contacts are to be formed, wherein said implantation is performed such that, after said annealing step, said fourth dopant achieves a diffusion depth that is less than a diffusion depth achieved by said first dopant.

17. The method according to claim 14, wherein said thermal anneal step is performed at a temperature of less than 1000° C.

18. The method according to claim 17, wherein said thermal anneal step is performed for a time duration of approximately 30 minutes.

19. The method according to claim 14, further comprising the step of:

implanting, prior to said annealing step, a fourth dopant of said second conductivity type into regions where body contacts are to be formed, wherein said implantation is performed such that, after said annealing step, said fourth dopant achieves a diffusion depth that is less than a diffusion depth achieved by said first dopant.

20. The method according to claim 14, wherein said first dopant is comprised of boron.

21. The method according to claim 14, wherein said second dopant and said third dopant are each comprised of arsenic.

22. The method according to claim 19, wherein said fourth dopant is comprised of boron, implanted in the form of boron fluoride.

* * * * *